(12) United States Patent
Jiang et al.

(10) Patent No.: US 10,002,879 B2
(45) Date of Patent: Jun. 19, 2018

(54) SEMICONDUCTOR STRUCTURE HAVING GATE REPLACEMENT AND METHOD FOR MANUFACTURING THE SAME

(71) Applicant: MACRONIX INTERNATIONAL CO., LTD., Hsinchu (TW)

(72) Inventors: Yu-Wei Jiang, Hsinchu (TW); Jia-Rong Chiou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days. days.

(21) Appl. No.: 15/092,856

(22) Filed: Apr. 7, 2016

(65) Prior Publication Data

US 2017/0294444 A1    Oct. 12, 2017

(51) Int. Cl.
| H01L 27/11582 | (2017.01) |
| H01L 27/11568 | (2017.01) |
| H01L 23/522 | (2006.01) |
| H01L 23/532 | (2006.01) |
| H01L 29/10 | (2006.01) |
| H01L 29/04 | (2006.01) |
| H01L 29/16 | (2006.01) |

(52) U.S. Cl.
CPC .... *H01L 27/11582* (2013.01); *H01L 23/5226* (2013.01); *H01L 23/53257* (2013.01); *H01L 27/11568* (2013.01); *H01L 29/04* (2013.01); *H01L 29/1037* (2013.01); *H01L 29/16* (2013.01)

(58) Field of Classification Search
CPC .............. H01L 23/53257; H01L 29/1037
See application file for complete search history.

(56) References Cited

U.S. PATENT DOCUMENTS

| 9,525,065 | B1 * | 12/2016 | Kyeon ............... H01L 29/7827 257/290 |
| 2011/0079839 | A1 * | 4/2011 | Albert .............. H01L 27/11521 257/321 |
| 2014/0084357 | A1 | 3/2014 | Choi et al. |
| 2015/0236039 | A1 * | 8/2015 | Kim ................ H01L 27/11582 438/269 |

OTHER PUBLICATIONS

TIPO Office Action dated Feb. 26, 2018 in Taiwan application (No. 105110875).

* cited by examiner

*Primary Examiner* — Moazzam Hossain
*Assistant Examiner* — Farun Lu
(74) *Attorney, Agent, or Firm* — McClure, Qualey & Rodack, LLP

(57) ABSTRACT

A semiconductor structure is provided. The semiconductor structure includes a substrate, a plurality of first stacked structures and two second stacked structures disposed on the substrate. Each of the first stacked structures includes alternately stacked metal layers and oxide layers. Each of the second stacked structures includes alternately stacked silicon nitride layers and oxide layers. The first stacked structures are disposed between the two second stacked structures.

10 Claims, 12 Drawing Sheets

SEMICONDUCTOR STRUCTURE HAVING GATE REPLACEMENT AND METHOD FOR MANUFACTURING THE SAME

TECHNICAL FIELD

The disclosure relates in general to a semiconductor structure and a method for manufacturing the same, and more particularly to a semiconductor structure having gate replacement and a method for manufacturing the same.

BACKGROUND

Semiconductor structures are used in storage elements for many products such as MP3 players, digital cameras, computer files, etc. As the application increases, the demand for the semiconductor structures focuses on small size and large memory capacity.

Designers develop a method for improving the densities of the semiconductor structures, using 3D stack semiconductor structures so as to increase a memory capacity and decrease a cost per cell. However, in 3D devices, especially in OP (oxide/polysilicon) stacking semiconductor structures, the word line resistance is the key factor since the word line resistance will impact the operation speed. Therefore, it is important to manufacture semiconductor structures which can effectively reduce the word line resistance.

SUMMARY

The disclosure is directed to a semiconductor structure having gate replacement and a method for manufacturing the same. In some embodiments of the disclosure, the metal layers used in the semiconductor structure may reduce the word line resistance and save the word line metal routing for the single gate vertical channel (SGVC) device structure.

According to one embodiment, a semiconductor structure is provided. The semiconductor structure includes a substrate, a plurality of first stacked structures and two second stacked structures disposed on the substrate. Each of the first stacked structures includes alternately stacked metal layers and oxide layers. Each of the second stacked structures includes alternately stacked silicon nitride layers and oxide layers. The first stacked structures are disposed between the two second stacked structures.

According to another embodiment, a method for manufacturing a semiconductor structure includes the following steps. A substrate is provides. A plurality of silicon nitride layers and oxide layers are alternately stacked. The silicon nitride layers and the oxide layers are etched to form a plurality of pre-stacked structures. A first charge trapping layer is formed on the pre-stacked structures. A first channel layer is formed on the first charge trapping layer. A portion of the pre-stacked structures is etched to form a plurality of through holes. The silicon nitride layers in the portion of the pre-stacked structures are replaced with a plurality of metal layers to form a plurality of first stacked structures. Another portion of the pre-stacked structures forms two second stacked structure, and the first stacked structures are disposed between the two second stacked structures.

Figure 1A:
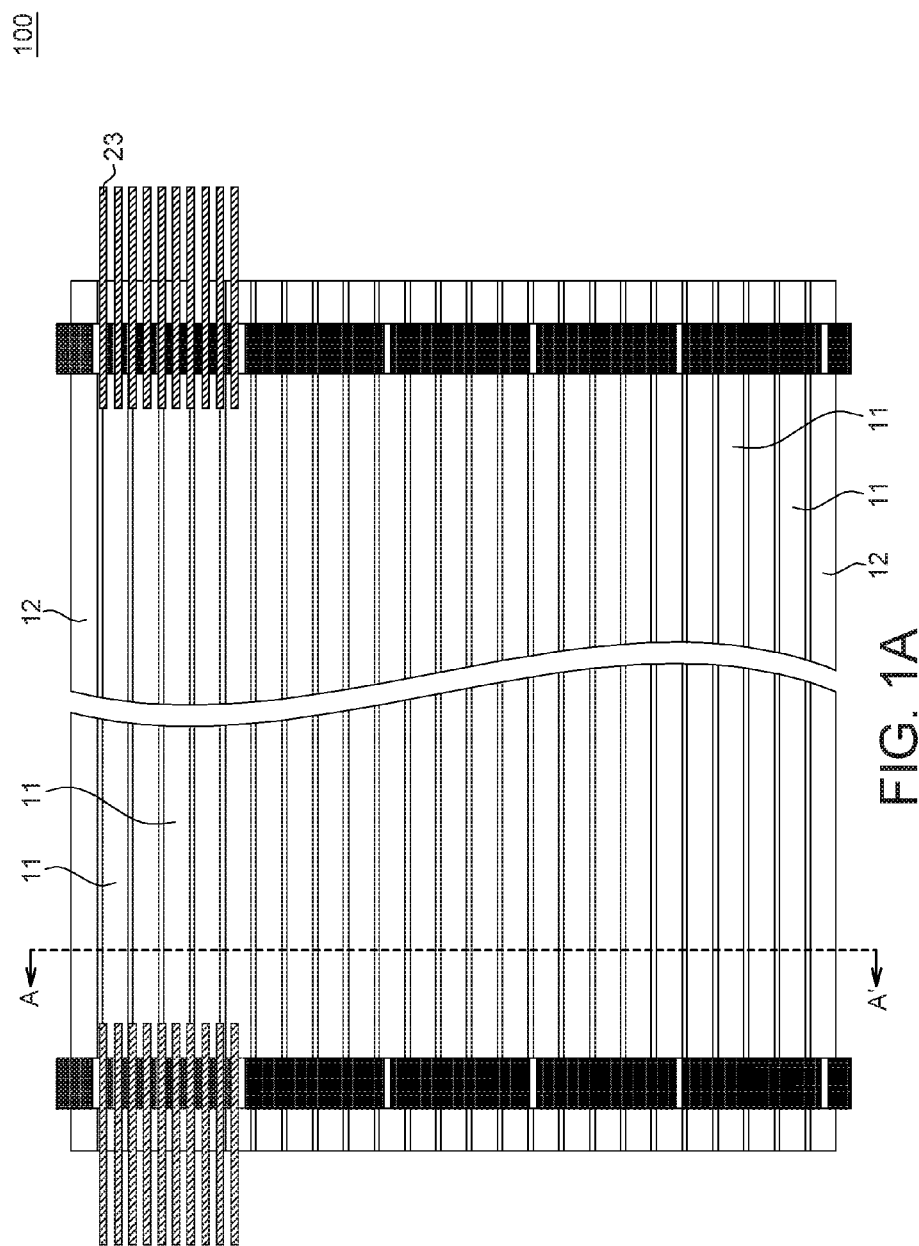
FIG. 1A illustrates a top view of a semiconductor structure in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and there may be other embodiments of the present disclosure which are not specifically illustrated. Thus, the specification and the drawings are regarded as an illustrative sense rather than a restrictive sense.

Figure 1B:
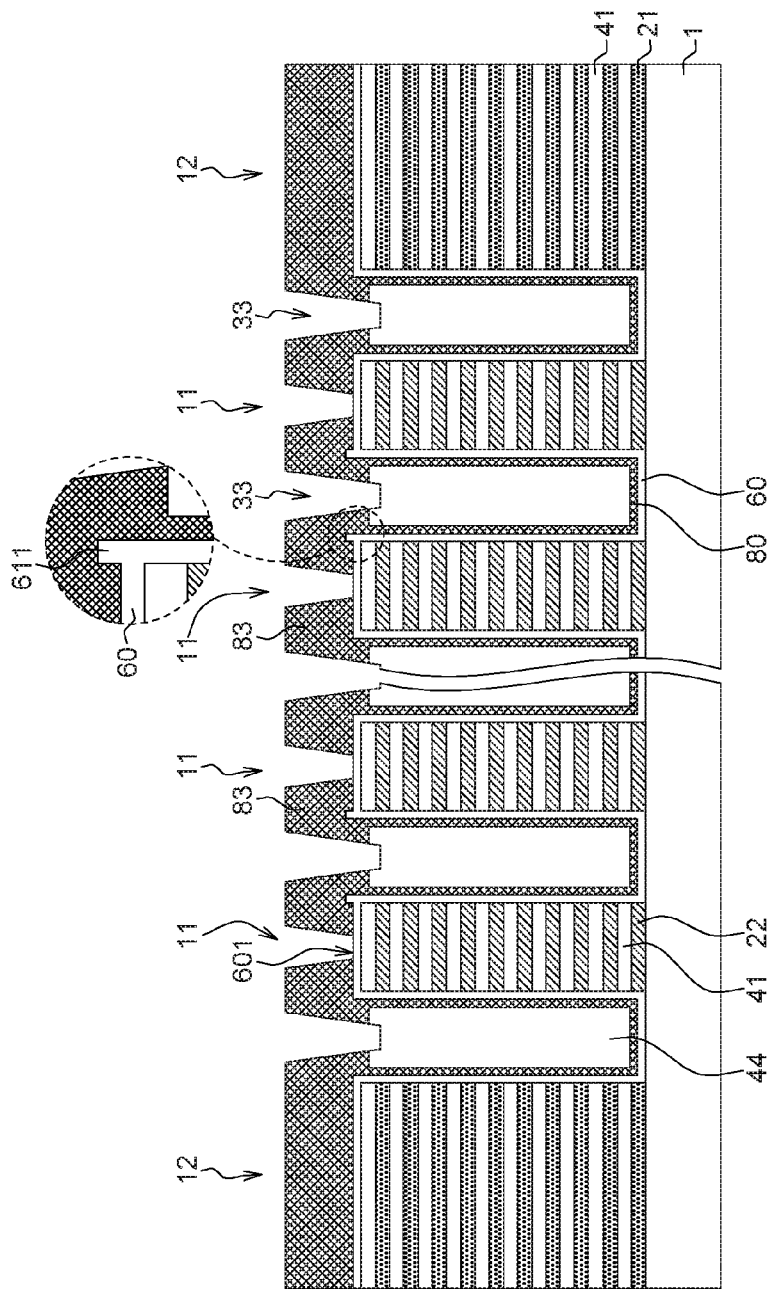
FIG. 1B illustrates a cross-section view of the semiconductor structure along A-A' line in FIG. 1A.

FIG. 1A illustrates a top view of a semiconductor structure 100 in one embodiment according to the disclosure. FIG. 1B illustrates a cross-section view of the semiconductor structure 100 along A-A' line in FIG. 1A. It should be noted that some elements may be omitted for illustrating the relationships between other elements more clearly.

In this embodiment according to the disclosure, the semiconductor structure 100 may include a substrate 1 and a plurality of first stacked structures 11 and two second stacked structures 12 disposed on the substrate 1. As shown in FIG. 1A, the semiconductor structure 100 may further include a plurality of word line metal routing 23 disposed on the boundary of the semiconductor structure 100. As shown in FIG. 1B, each of the first stacked structures 11 may include alternately stacked metal layers 22 and oxide layers 41; while each of the second stacked structures 12 may include alternately stacked silicon nitride layers 21 and oxide layers 41.

In this embodiment, the first stacked structures 11 are disposed between the two second stacked structures 12. Further, the number of the first stacked structures may be $2^N$, where N is positive integer. Here, the metal layers 22 may include tungsten (W).

As shown in FIG. 1B, the semiconductor structure 100 may further include a charge trapping layer 60 disposed on the first stacked structure 11 and a channel layer 80 disposed on the charge trapping layer 60. In one embodiment, the charge trapping layer 60 may be an ONO structure, an ONONO structure, or an ONONONO structure, and the channel layer 80 may include polysilicon.

As shown in FIG. 1B, the charge trapping layer 60 may include a protrusion portion 611, such that a top surface of the charge trapping layer 60 may be uneven (not planar).

Further, the semiconductor structure 100 may also include a plurality of conductive plugs 83 and insulating layers 44. The conductive plugs 83 are electrically connected to the channel layer 80. The insulating layers 44 may be disposed between the first stacked structures 11. In this embodiment, the insulating layers 44 may be also disposed between the first stacked structures 11 and the second stacked structures 12.

Here, the insulating layers 44 may include oxide. In one embodiment, a portion of each of the insulating layers 44 between the conductive plugs 83 and a portion of a top surface 601 of the charge trapping layer 60 may be exposed. That is, spaces 33 may be formed between the conductive plugs 83, such that the portion of each of the insulating layers 83 and the portion of the top surface 601 of the charge trapping layer 60 may be exposed.

FIG. 2A to FIG. 10 illustrate a process for manufacturing the semiconductor structure 100 in one embodiment according to the disclosure. First, a substrate 1 is provided. Then, a plurality of silicon nitride layers 21 and oxide layers 41 are alternately stacked on the substrate 1. In this embodiment, the silicon nitride layers 21 and the oxide layers 41 are etched to form a plurality of pre-stacked structures 10.

Figure 2A:
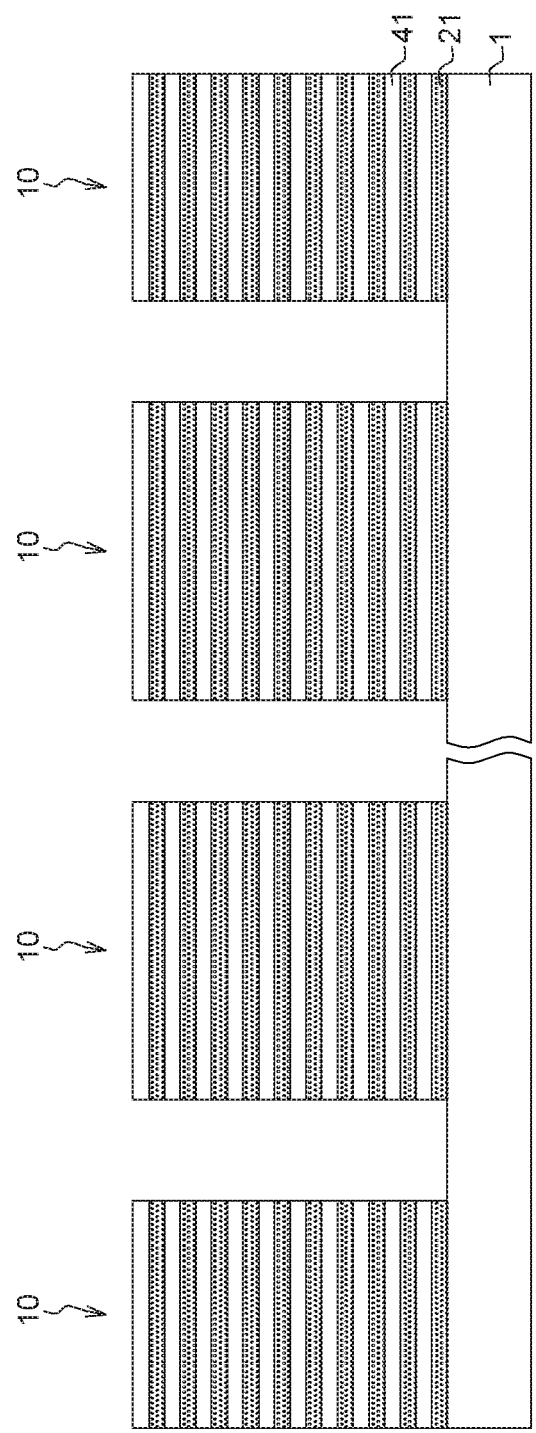
FIG. 2A to FIG. 10 illustrate a process for manufacturing the semiconductor structure in one embodiment according to the disclosure.
Figure 2B:
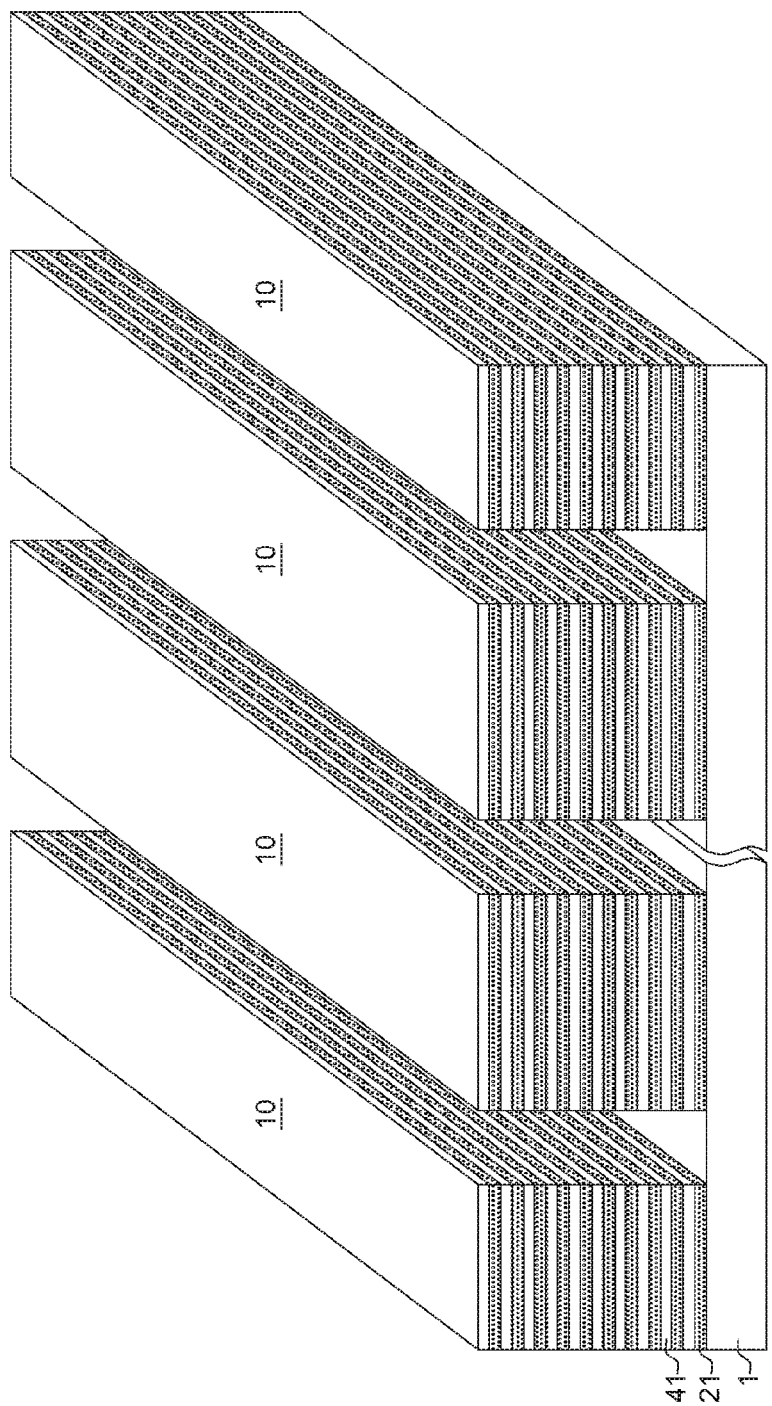

That is, each of the pre-stacked structures 10 may include alternately stacked silicon nitride layers 21 and oxide layers 41 as shown in FIG. 2A and FIG. 2B. Here, FIG. 2A may illustrate a cross-section view of the semiconductor structure in this step, while FIG. 2B may illustrate a 3D schematic diagram of the semiconductor structure in this step.

Figure 3:
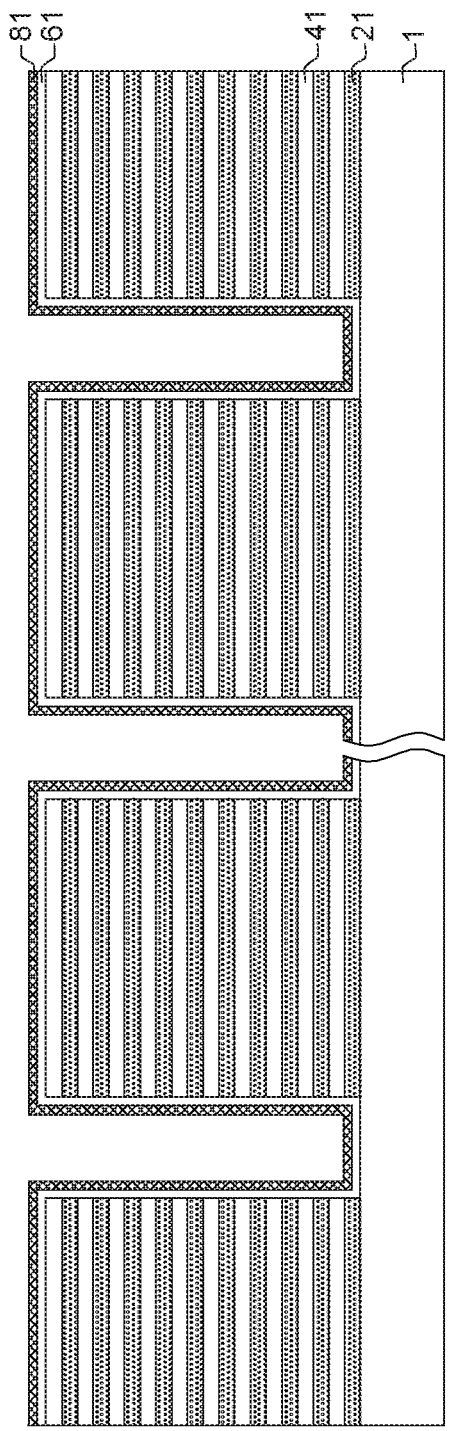

As shown in FIG. 3, a first charge trapping layer 61 is deposited on the pre-stacked structures 10, and a first channel layer 81 is formed on the first charge trapping layer 61. In this embodiment, the first charge trapping layer 61 may be an ONO structure, an ONONO structure, or an ONONONO structure, and the first channel layer 81 may include polysilicon. However, the disclosure is not limited thereto.

Figure 4:
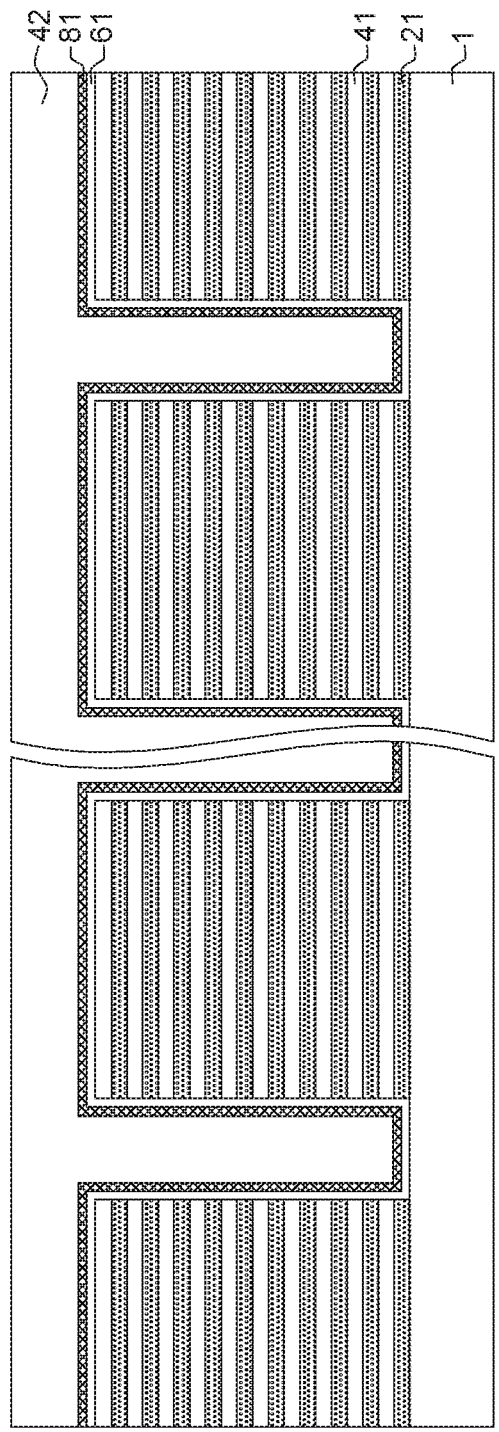

As shown in FIG. 4, an oxide layer 42 is formed on the first channel layer 81. In this embodiment, the remained spaces of the pre-stacked structures 10 may be filled with the oxide layer 42.

Figure 5:
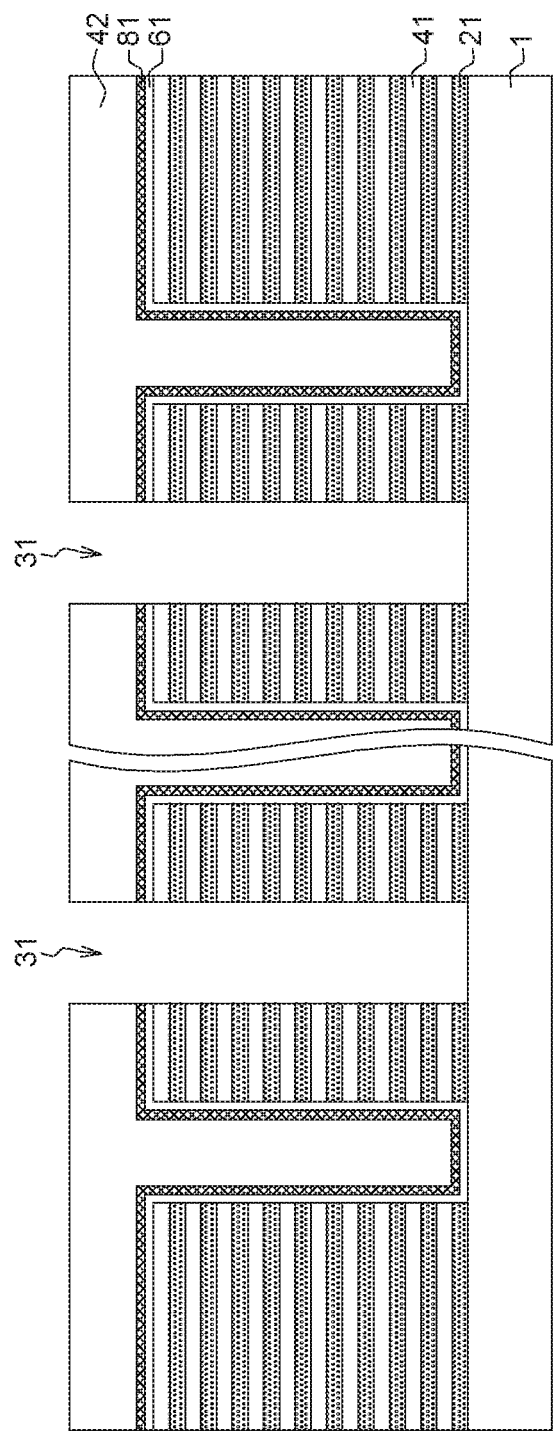

As shown in FIG. 5, a portion of the pre-stacked structures 10 are etched to form a plurality of through holes 31. Here, a portion of the top surface of the substrate 1 may be exposed by the through holes 31.

Figure 6:
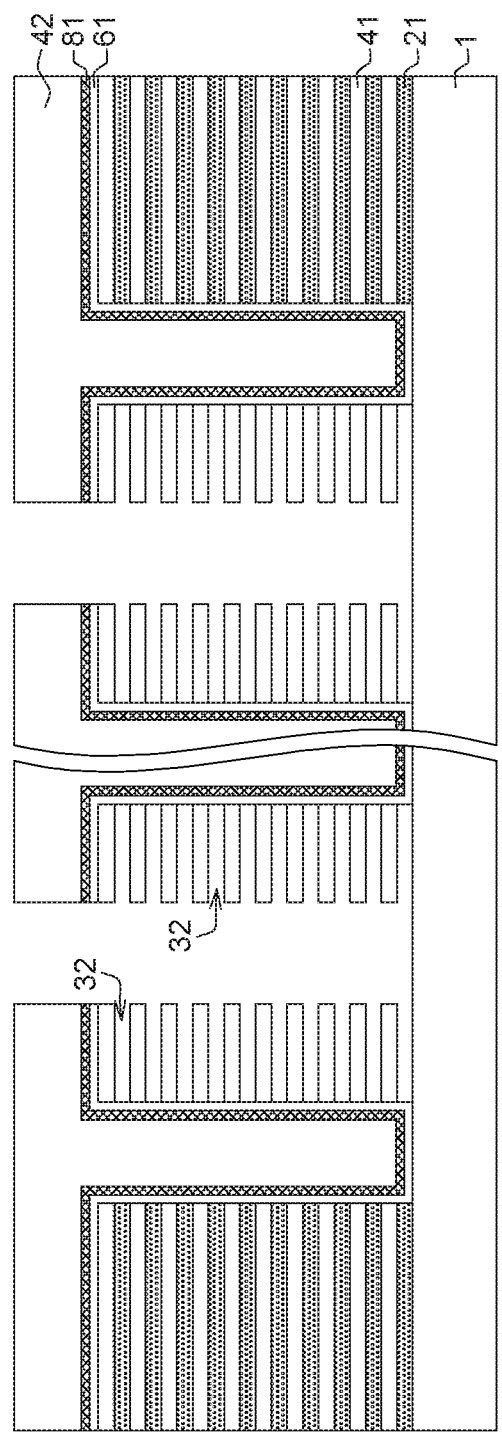

As shown in FIG. 6, the silicon nitride layers 21 in the portion of the pre-stacked structures 10 are removed to form a plurality of spaces 32 between the oxide layers 41 in the portion of the pre-stacked structures 10. In one embodiment, the silicon nitride layers 21 may be removed by hot phosphoric acid ($H_3PO_4$).

Figure 7:
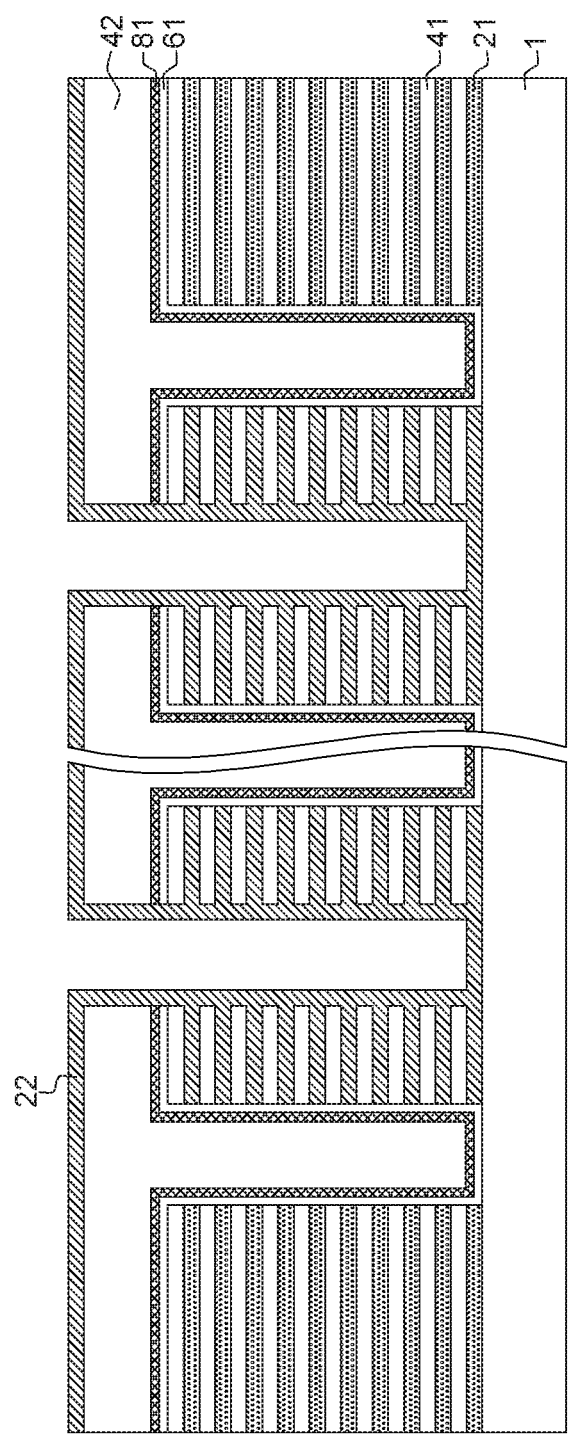
Figure 8:
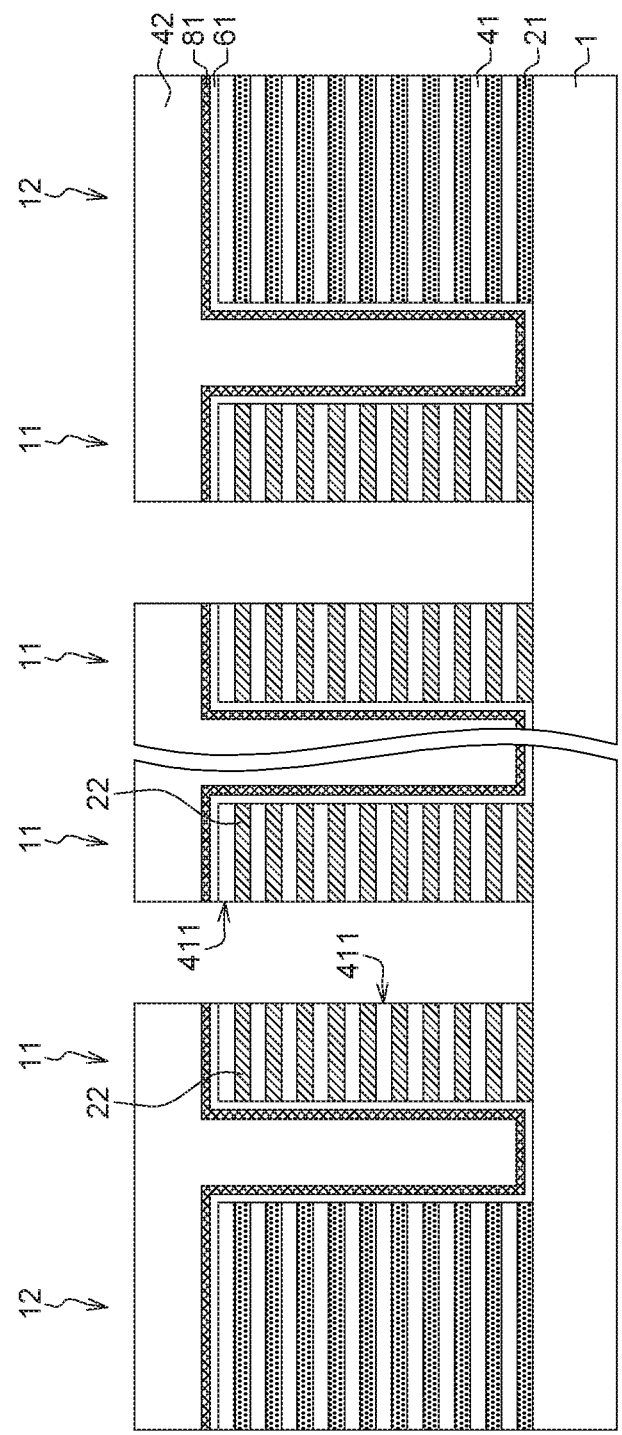

As shown in FIG. 7, a plurality of metal layers 22 is formed in the spaces 32 and on the oxide layer 42. In this embodiment, the metal layers 22 may include tungsten (W). Then, a portion of metal layers 22 is removed (etched) to expose side surfaces 411 of the oxide layers 41 in the portion of the pre-stacked structures 10. That is, the silicon nitride layers 21 in the portion of the pre-stacked structures 10 may be replaced with the plurality of metal layers 22 to form a plurality of first stacked structures 11, while another portion of the pre-stacked structures may form two second stacked structure 12 as shown in FIG. 8, which may be called as a gate replacement step. Further, the first stacked structures 11 may be disposed between the two second stacked structures 12.

Figure 9:
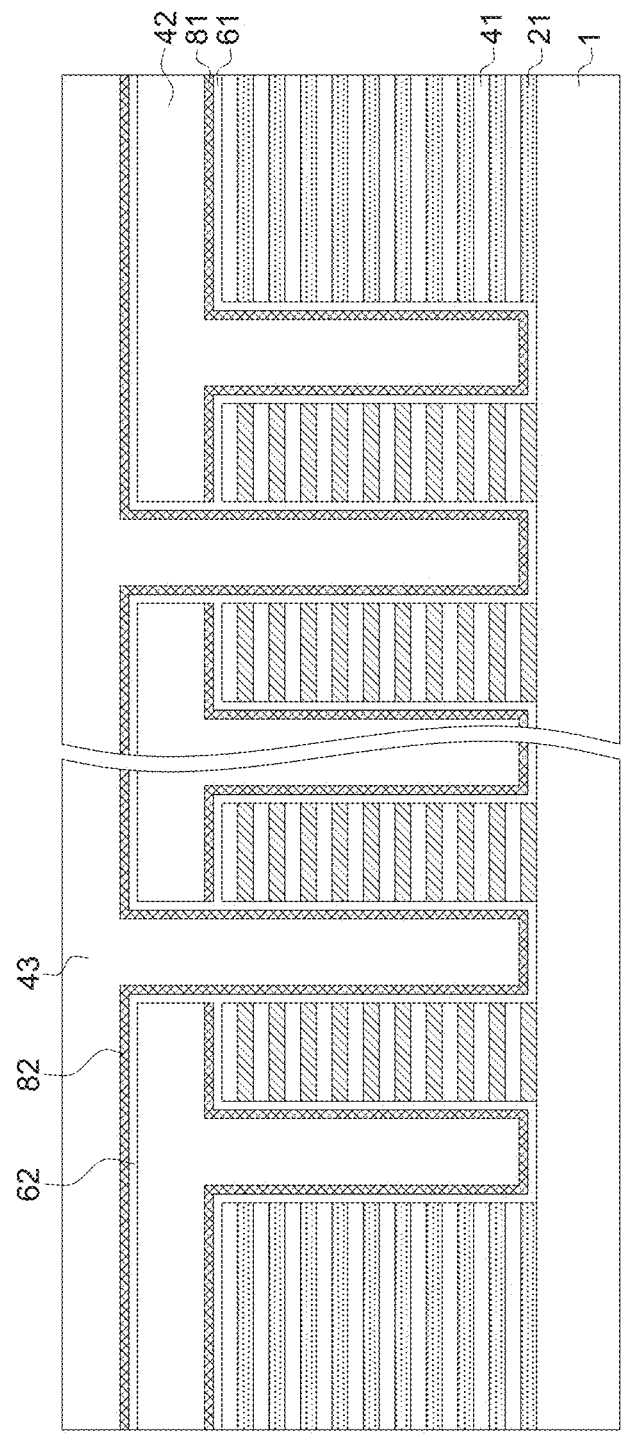

As shown in FIG. 9, a second charge trapping layer 62 is formed in the through holes 31 and on the oxide layer 42, and a second channel layer 82 is formed on the second charge trapping layer 62. Then, an oxide layer 43 is formed on the second channel layer 82. Here, the through holes 31 may be filled with the oxide layer 43 as shown in FIG. 9.

Similarly, the second charge trapping layer 62 may be an ONO structure, an ONONO structure, or an ONONONO structure, and the second channel layer 82 may include polysilicon. However, the disclosure is not limited thereto.

Figure 10:
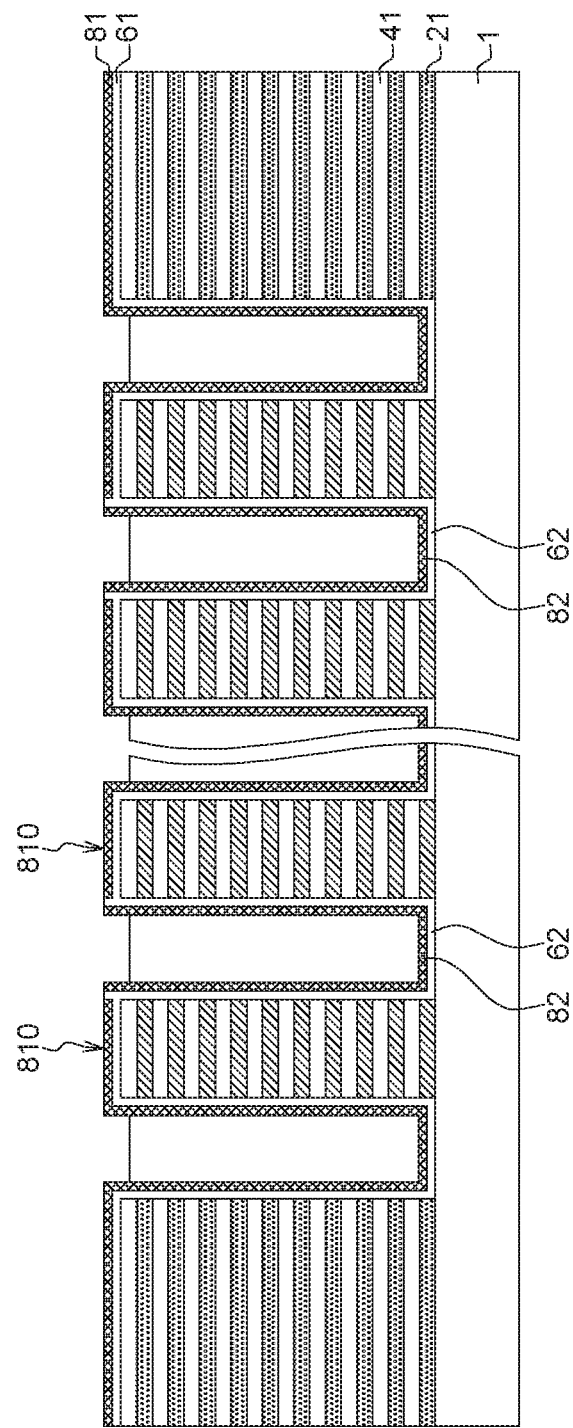

As shown in FIG. 10, a portion of the oxide layer 43, a portion of the second charge trapping layer 62, a portion of the second channel layer 82, and a portion of the oxide layer 42 may be removed, such that the top surface of the first channel layer 81 may be exposed. In some embodiments, the portion of the oxide layer 43, the portion of the second charge trapping layer 62, the portion of the second channel layer 82, and the portion of the oxide layer 42 may be removed by a chemical-mechanical planarization (CMP) process or an dry etching process.

In this embodiment, top surfaces of the remained oxide layers may be lower than the top surface 810 of the first channel layer 81. However, the disclosure is not limited thereto.

Then, a plurality of conductive plugs 83 is formed on the first stacked structures 11, such that the semiconductor structure 100 as shown in FIG. 1B may be formed. Here, the conductive plugs 83 are electrically connected to the first channel layer 81 and the second channel layer 82.

In one embodiment, the method of forming the conductive plugs 83 may include the following steps. First, a polysilicon layer is deposited on the first stacked structures 11. Then, the polysilicon layer is etched to expose a portion of the first charge trapping layer 61.

It should be noted that the first charge trapping layer 61 and the second charge trapping layer 62 in FIG. 10 may be regarded as the charge trapping layer 60 in FIG. 1B; the first channel layer 81 and the second channel layer 82 in FIG. 10 may be regarded as the channel layer 80 in FIG. 1B; the remained oxide layers in FIG. 10 may be regarded as the insulating layers 44 in FIG. 1B.

That is, the insulating layers 44 may be formed between the first stacked structures 11, and a portion of the insulating layer 44 between the conductive plugs 83 may be exposed.

According to the embodiments of the disclosure, the programmable logic array pad only needs to be formed in right and left side of the whole block in the semiconductor structure 100, and the routing in the array region can be simpler due to the word line selection only existed in the right/left side of the whole array region.

Further, the word line resistance may be reduced by the gate replacement step to save the word metal routing for the single gate vertical channel (SGVC) device structure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a substrate;
   a plurality of first stacked structures disposed on the substrate, each of the first stacked structures comprising alternately stacked metal layers and oxide layers;
   two second stacked structures disposed on the substrate, each of the second stacked structures comprising alternately stacked silicon nitride layers and oxide layers;
   a first charge trapping layer having a first portion disposed on the second stacked structure, the first portion conformally covering both a top surface and a side surface of each of the second stacked structures; and
   a second charge trapping layer disposed on the first stacked structures,
   wherein the first stacked structures are disposed between the two second stacked structures.

2. The semiconductor structure according to claim 1, wherein the metal layers comprise tungsten.

3. The semiconductor structure according to claim 1, further comprising:

a channel layer disposed on the first charge trapping layer and the second charge trapping layer.

4. The semiconductor structure according to claim 3, wherein the first charge trapping layer and the second charge trapping layer are ONO structures, ONONO structures, or ONONONO structures.

5. The semiconductor structure according to claim 3, wherein the channel layer comprises polysilicon.

6. The semiconductor structure according to claim 3, wherein the first charge trapping layer and the second charge trapping layer have protrusion portions, such that top surfaces of the first charge trapping layer and the second charge trapping layer are uneven.

7. The semiconductor structure according to claim 3, further comprising:
   a plurality of conductive plugs electrically connected to the channel layer.

8. The semiconductor structure according to claim 7, further comprising:
   an insulating layer disposed between the first stacked structures;
   wherein a portion of the insulating layer between the conductive plugs is exposed.

9. The semiconductor structure according to claim 8, wherein the insulating layer comprises oxide.

10. The semiconductor structure according to claim 1, wherein the first charge trapping layer further comprises a second portion disposed on the first stacked structures, the second portion of first charge trapping layer and the second charge trapping layer are alternatively allocated in different through holes that are filled with insulating material.

* * * * *